(12) United States Patent
Bessendorf et al.

(10) Patent No.: US 6,239,702 B1
(45) Date of Patent: *May 29, 2001

(54) ELECTROMAGNETIC ENERGY DETECTION

(75) Inventors: Simon Bessendorf, Brighton; Richard V. Kemper, Westford; William A. Sciarretta, Lexington; Edward T. Lewis, Sudbury, all of MA (US)

(73) Assignee: Raytheon Company, Lexington, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/038,251

(22) Filed: Mar. 10, 1998

(51) Int. Cl.[7] .................................................. G08B 13/18

(52) U.S. Cl. ..................... 340/552; 340/551; 340/553; 250/370.09

(58) Field of Search ...................................... 340/551, 552, 340/553; 257/232, 233, 291, 292, 446, 448; 250/370.08, 370.09, 370.11, 370.14

(56) References Cited

U.S. PATENT DOCUMENTS

| | | | |
|---|---|---|---|
| 5,465,238 | * | 11/1995 | Russell ................................. 365/234 |
| 5,475,212 | * | 12/1995 | Nelson et al. .................. 250/370.08 |
| 5,648,674 | * | 7/1997 | Weisfield et al. ..................... 257/428 |
| 5,734,188 | * | 3/1998 | Murata et al. ........................ 257/401 |
| 5,744,807 | * | 4/1998 | Weisfield ........................ 250/370.08 |
| 5,770,871 | * | 6/1998 | Weisfield ............................. 257/232 |
| 5,856,694 | * | 1/1999 | Kurachi ................................ 257/360 |

OTHER PUBLICATIONS

C. Matsumoto, "Startup Develops a CCD–CMOS Hybrid", Electronic Engineering Times Article, Issue 935, Jan. 6, 1997.

Suni Imaging Microsystems, Inc., Press Release, "Suni Imaging Microsystems, Inc. Announces Advanced CMOS/CCD Product Alliance With Leading U.S. Dental Imaging Company", Nov. 3, 1997.

Troy, "New Sensor Combines CMOS and CCD", Photonics Spectra Online, Technology News, Dec. 1997.

Suni Imaging Microsystems, Inc., "Company Profile" Nov. 1997.

Matsumoto, "Startup Develops a CCD–CMOS Hybrid" Embedded Systems Conference Spring.

* cited by examiner

Primary Examiner—Van Trieu
(74) Attorney, Agent, or Firm—Daly, Crowley & Mofford

(57) ABSTRACT

The invention provides apparatus and methods for detecting electromagnetic energy using an array of detectors arranged in at least one row and multiple columns. A single crystal body has multiple doped regions disposed therein. Each one of the detectors produces charge in a corresponding one of the doped regions in the body in response to electromagnetic energy impinging upon that detector. A first charge transfer device includes an output port and multiple serially coupled charge storage cells including multiple first charge transfer regions disposed in the body parallel to the row, or rows, of detectors. Multiple second charge transfer devices include multiple second charge transfer regions disposed in the body transverse to the row, or rows, of detectors and the charge storage cells. Each one of the second charge transfer regions is adapted to transfer charge produced in a corresponding one of the doped regions to a corresponding one of the charge storage cells. Each one of the doped regions corresponding to one of the detectors has a doping profile adapted to produce an electric field in a direction from the doped region toward a corresponding one of the multiple second charge transfer regions. Such an arrangement allows dual polarization detection with little or no modification of the system configuration.

34 Claims, 11 Drawing Sheets

ELECTROMAGNETIC ENERGY DETECTION

BACKGROUND OF THE INVENTION

This invention relates generally to energy detection systems and more particularly to energy detection systems disposed on a single crystal substrate.

As is known in the art, electromagnetic energy detection systems have a wide range of application, e.g. from cameras to missile seekers. In such systems, electromagnetic energy, e.g., visible light or infrared energy, is focused by an optical system onto one, or more, electromagnetic energy detectors. These detectors are often arranged in an array which is disposed at the focal plane of the optical system. The detector produces an indication of the detected energy by, for example, producing a corresponding electrical output signal. In one focal plane array, the detectors are semiconductor devices, such as HgCdTe or InSb, formed in different isolated regions of an upper surface of a single crystal semiconductor body. Thus, in response to light impinging upon the detector, charge is produced in the corresponding isolated region of the semiconductor body having the detector.

In one system, a read-out electronics ("ROE"), formed as an integrated circuit in a second semiconductor substrate, typically silicon, is mounted to a back surface of the first-mentioned substrate. The charge produced in the first-mentioned substrate passes to different isolated regions of the second-mentioned substrate through electrical contacts disposed therebetween. The read-out electronics provides clock signals to regulate the propagation of charge in the second-mentioned substrate to output signal processing circuitry. In order to transfer the charge produced in the first-mentioned substrate to the second substrate, a wire or other metal contacts are connected to ohmic contact diffusion regions in the semiconductor bodies to provide electrical contact. The ohmic contact regions result in the generation of generation-recombination (GR) noise. While this technique may be acceptable for some wavelengths of energy, the GR noise produced may create, in some applications, an unacceptably low signal to noise ratio (SNR) for some combinations of wavelength and substrate.

The use of a single silicon substrate for both the detectors and the read-out electronics has been suggested. However, with a silicon substrate, near infrared energy above about 8,000 Å passes readily through the substrate without generating sufficient charge for system SNR requirements. One technique has been presented in two articles, one entitled "Active-Pixel Image Sensor Integrated With Readout Circuits," by Robert Nixon, Eric Fossum, and Sabrina Kemeny and the other entitled "CMOS Active-Pixel Image Sensor Containing Pinned Photodiodes," by Eric R. Fossum both published in NASA Tech Briefs, October, 1996, from NASA's Jet Propulsion Laboratory in Pasadena, Calif. In the articles, the authors describe an attempt at an image sensor including readout circuits and pinned diode detectors, for visible and ultraviolet light, on one chip. According to the second-mentioned article, however, the operation of the device has not been demonstrated.

SUMMARY OF THE INVENTION

In accordance with one feature of the invention, an electromagnetic energy detection system is provided having a plurality of detectors disposed in a single crystal body. Each one of the detectors is adapted to produce charge in a doped region disposed in the body in response to electromagnetic energy impinging upon such one of the detectors. A first charge transfer device ("CTD") is provided having a plurality of first charge transfer regions disposed in the body and includes a plurality of serially coupled charge storage cells. A plurality of second charge transfer devices is provided for transferring the charge in a corresponding one of the doped regions to a corresponding one of the charge storage cells of the first charge transfer device.

With such an arrangement, ohmic contacts between each one of the detectors and the charge storage cells of the first charge transfer device are eliminated thereby reducing GR noise and improving the SNR performance of the detection system.

In accordance with another feature of the invention, an electromagnetic energy detection system is provided having a plurality of detectors disposed in a single crystal body. Each one of the detectors is adapted to produce charge in the body in response to electromagnetic energy impinging upon such one of the detectors. Read-out electronics is disposed on the body. The read-out electronics includes a first charge transfer device having a plurality of first charge transfer regions disposed in the body and includes a plurality of serially coupled charge storage cells. A last one of the cells is coupled to an output port. A charge coupling structure is disposed on the body to couple the charge produced by the detectors to the read-out electronics, The charge coupling structure includes a plurality of second charge transfer devices, including a plurality of second charge transfer regions, disposed in the body. Each one of the plurality of second charge transfer regions is adapted to transfer charge produced in a corresponding one of the detectors to a corresponding one of the plurality of charge storage cells. With such an arrangement, an effective electromagnetic energy detection system is provided wherein energy detectors, charge coupling structure and read-out electronics are formed on a single crystal substrate.

In a preferred embodiment of the invention, a shield is provided to reduce incident electromagnetic energy from impinging upon portions of the read-out electronics and portions of the charge coupling structure.

In accordance with still another feature of the invention, a detector is provided having a single crystal body with a doped region therein. Such detector is adapted to produce charge in the doped region in response to electromagnetic energy impinging upon such detector. A second region is disposed in the body and laterally displaced from the detector. The doped region has a doping profile selected to produce an electric field therein along a direction from the doped region toward the second region.

With such a structure, charge produced in the body is efficiently transferred from the doped region to a region displaced therefrom for processing by electronic circuitry also disposed on the body.

In a preferred embodiment, the body comprises silicon and the detector comprises a light detector.

In accordance with still another feature of the invention, apparatus is provided for reducing noise, e.g., transients, in an output of a charge transfer device formed in a first region of a single crystal body. Such apparatus includes a transient suppression circuit. The circuit includes a pair of inputs; one of the inputs being coupled to the output of the charge transfer device and the other input being coupled to a second region of the body displaced from the first region. The circuit includes a differencing arrangement for subtracting signals at the pair of inputs to reduce noise components on at least one of such signals.

With such an arrangement, noise generated in the body is present at the output of the charge transfer device, along with a desired signal, and is also present in the second region of the body. Therefore, substantially the same noise is present at both of the inputs of the transient suppression circuit. The differencing arrangement combines the two signals at the two inputs to thereby cancel, or reduce, the noise present at the output of the charge transfer device thereby yielding the desired signal with a reduced noise component.

In accordance with another feature of the invention, an electromagnetic energy detection system is provided having a single crystal body. A detector is disposed in a first region the body. The detector produces charge in the body in response to electromagnetic energy impinging upon such detector. At least a portion of the produced charge passes through a second region of the body to an output port. A charge detector, disposed in the body, is coupled to the output port and produces a charge detector output signal indicative of detected charge. A sensor having an input port coupled to the body in a third region of the body produces a sensor output signal indicative of signals induced on the input port.

In a preferred embodiment, a differencing device is provided. The charge detector, the sensor, and the differencing device are arranged to provide an output indicative of detected energy. A first transfer device is provided to couple the produced charge from the detector to the output port. The charge detector is adapted to receive charges from the output port and to provide a charge detector signal. The sensor has an input coupled to the body in the third region of the body and is adapted to provide a sensor output signal. The differencing device is adapted to receive the charge detector signal and the sensor output signal to provide a difference output signal indicative of a difference of the sensor output signal and the charge detector signal. With such an arrangement, common mode noise is reduced, improving the dynamic range of the signal processing channel receiving the detected energy.

The invention provides numerous other advantages. For example, the invention provides a fully integrated system for real time image acquisition. Integrating multiphase clock generators, detectors, and read-out electronics on a single chip avoids a complex interface of wires and external electronics, allowing for simple and efficient system performance. Doping configurations and detector selection allow ±5V power supplies to operate the charge transfer devices, e.g. Buried Channel Charge Coupled Devices (BCCDs), and "pinned" diode detectors. By using buried channel charge coupled devices, extraneous wires are eliminated, reducing GR noise and improving SNR, and reducing stray inductance and capacitance and electromagnetic interference. The invention is easily adapted for multispectral (color) imaging to achieve multimegapixel color imaging, small package size, and low price, which is useful for applications such as scanning digital cameras. The invention is also suited for laser tomography.

BRIEF DESCRIPTION OF THE DRAWING

Other features and advantages of the invention, as well as the invention itself, will become more readily apparent when taken together with the following detailed description and the accompanying drawings, in which.

DESCRIPTION OF THE PREFERRED EMBODIMENTS

GENERAL

Figure 1:
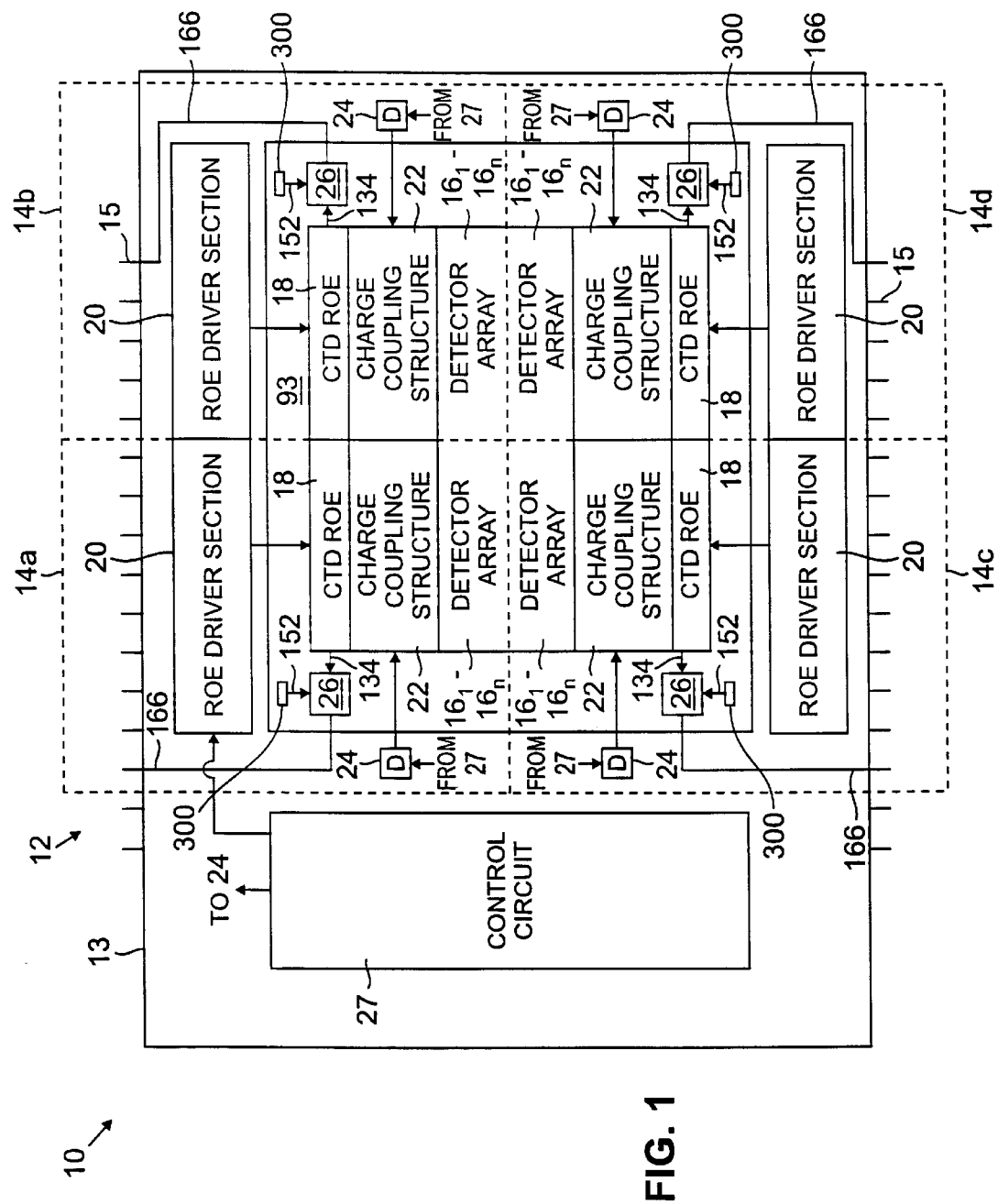
FIG. 1 is a diagrammatical layout of an electromagnetic energy detection system.

In FIG. 1, an electromagnetic energy detection system 10 is shown. The system 10 is formed on a single crystal semiconductor chip, or body 12, here having a p-type conductive silicon substrate 13. The detection system 10 is arranged in four similarly-structured quadrants 14a–14d. Each one of the quadrants 14a–14d includes an array of detectors $16_1$–$16_n$, a charge transfer device read-out electronics (CTD ROE) 18 coupled to a read-out electronics driver section 20, a charge coupling structure 22 coupled to a charge coupling structure driver section 24, and a transient signal suppression circuit 26, all arranged as shown. The system 10 further includes a control circuit 27 disposed at one end of the body 12 as shown. The CTD ROE 18 and portions of the charge coupling structure 22, as described below, are charge transfer devices, preferably buried channel charge coupled devices. Connections from the control circuit 27 to the driver sections 20 and 24, and from the driver sections 20 and 24 to the charge transfer device read-out electronics 18 and to the charge coupling structures 22, respectively, are bus connections. The body 12 includes a plurality of interface pins 15. An n-type guarding 93 is implanted (e.g., doped with Phosphorous) in the substrate 13 surrounding the detectors 16, charge coupling structures 22, charge transfer device read-out electronics 18, and transient suppression circuits 26, and is biased, e.g., to 5V. The guardring 93 transfers spurious noise charges away from the detectors $16_1$–$16_n$ and the charge transfer device read-out electronics 18 to help preserve the SNR of the system 10.

Figure 2:
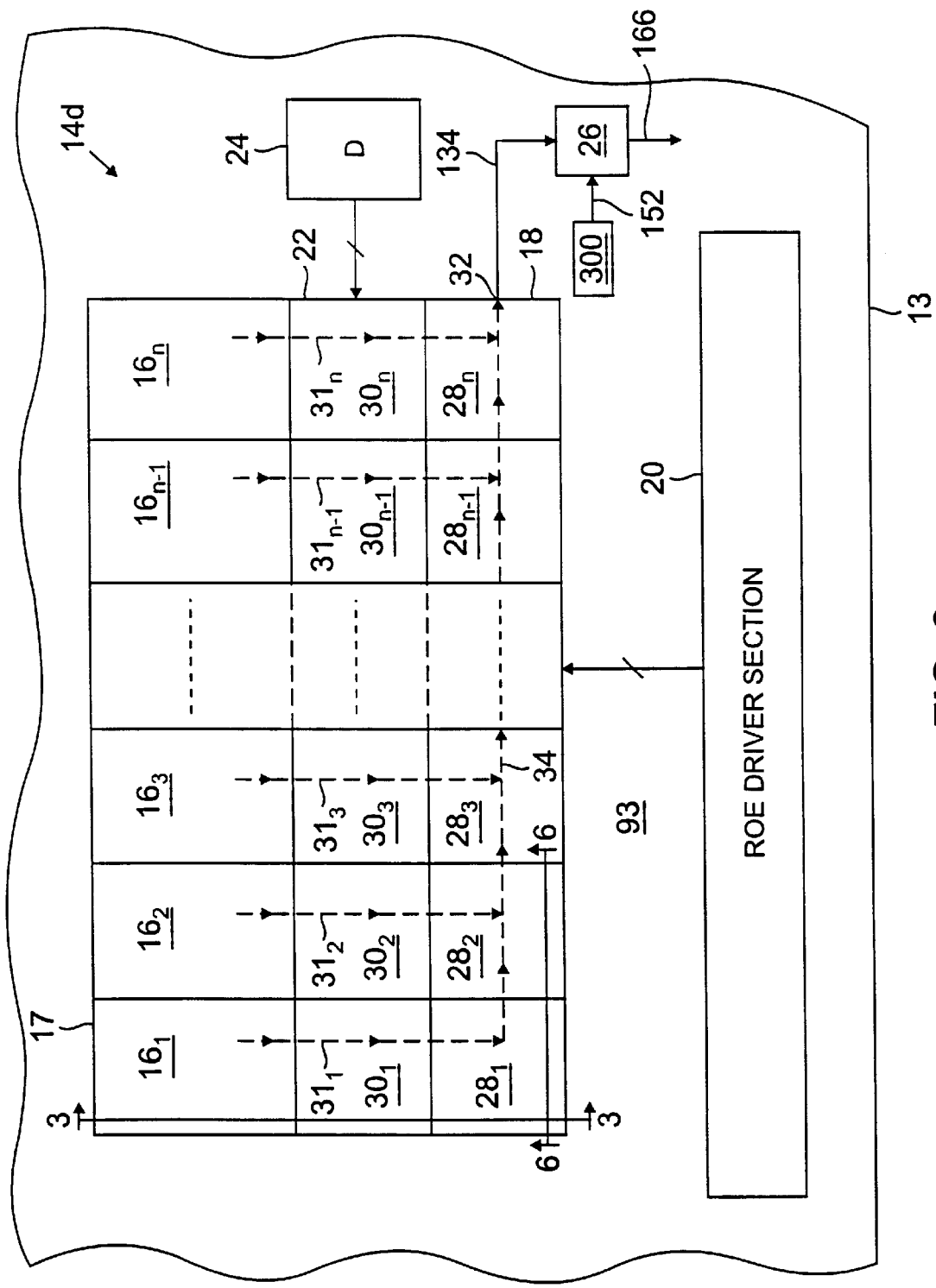
FIG. 2 is an enlarged view of a portion of the system of FIG. 1.

Referring now also to FIG. 2, an exemplary one of the quadrants 14a–14d, here quadrant 14d is shown. The quadrant 14d includes a linear array 17 of the detectors $16_1$–$16_n$. Each one of the detectors $16_1$–$16_n$ is here a pinned diode detector to be described in detail in connection with FIG. 3. Suffice it to say here, however, that each one of the detectors $16_1$–$16_n$ produces charge in body 12 in response to electromagnetic energy impinging upon such one of the detectors $16_1$–$16_n$. The charge transfer device read-out electronics 18 includes a plurality of serially coupled charge storage cells $28_1$–$28_n$. Each one of charge storage cells $28_1$–$28_n$ corresponds to one of the detectors $16_1$–$16_n$. The charge coupling structure 22 includes a plurality of charge transfer devices $30_1$–$30_n$ each one being between a corresponding one of the detectors $16_1$–$16_n$ and a corresponding one of the charge storage cells $28_1$–$28_n$.

The charge transfer devices $30_1$–$30_n$ are controlled by signals received from the charge coupling structure driver section 24 for transferring the charge in a corresponding one of the of the detectors $16_1$–$16_n$ through the substrate 13 to a corresponding one of the charge storage cells $28_1$–$28_n$ of the charge transfer device read-out electronics 18 as indicated by directional lines $31_1$–$31_n$.

The charge transfer device read-out electronics 18 is controlled by signals received from the read-out electronics driver section 20 for transferring charge received from the charge transfer devices $30_1$–$30_n$ through the substrate 13 to an output port 32 as indicated by directional line 34. More particularly, the read-out charge transfer device 18 includes the output port 32 which is fed by the last one of the serially coupled charge storage cells $28_1$–$28_n$, i.e., by $28_n$. The output port 32 is coupled to the transient signal suppression circuit 26. It is noted that the read-out electronics charge transfer device 18 is disposed parallel to the rows of detectors $16_1$–$16_n$. Each one of the charge transfer devices $30_1$–$30_n$ is disposed in the body 12 transverse to the linear array 17 of detectors $16_1$–$16_n$ and the charge storage cells $28_1$–$28_n$.

DETECTORS $16_1$–$16_n$

Figure 3:
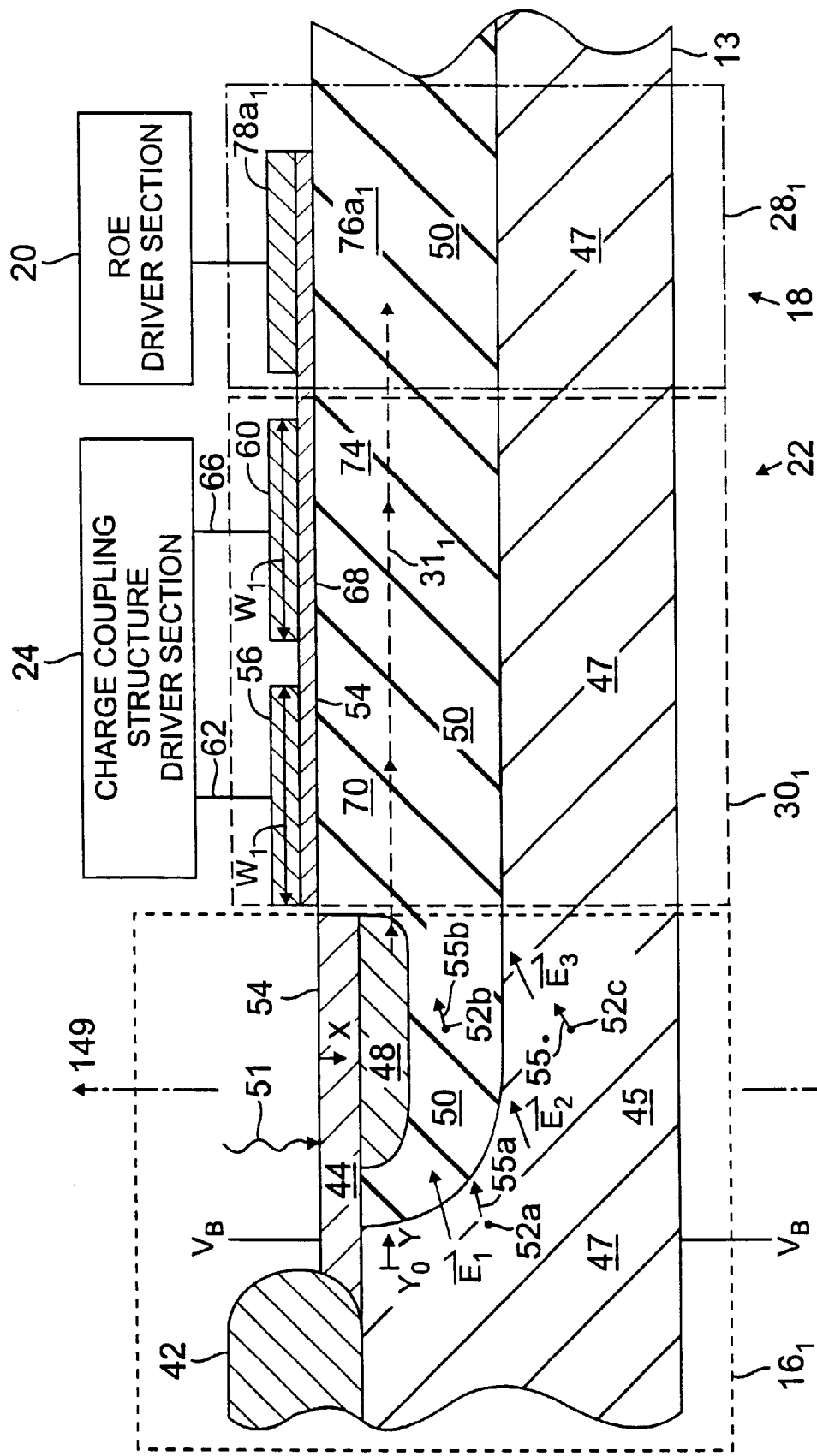
FIG. 3 is a simplified cross-sectional view of an electromagnetic detector and charge coupling structure, such cross-section being taken along line 3—3 in FIG. 2.

Referring now to FIG. 3, an exemplary one of the detectors $16_1$–$16_n$, here $16_1$, along with the corresponding charge transfer device $30_1$ of the charge coupling structure 22, and the corresponding charge storage cell $28_1$ of the read-out electronics charge transfer device 18, are shown. The detector $16_1$ is bordered on one end by a silicon dioxide insulator 42 and on the other end by the charge transfer device $30_1$. Such detector $16_1$ includes: a p-type anode 44 (e.g., doped with Boron), a cathode 45 provided by an undoped portion 47 of the substrate 13 (i.e., not altered from the original doping of the substrate 13), an n-type modulating layer 48, and an n-type Buried Channel Charge Coupled Device (BCCD) layer 50, all arranged as shown. The modulating layer 48 and the BCCD layer 50 are used to transfer charge produced by the detector $16_1$ through the substrate 13 to the corresponding charge storage cell $28_1$ of the charge transfer device read-out electronics 18 as indicated by directional arrow $31_1$. The cathode 45 is biased to the same potential as the anode 44, making the detector $16_1$ a "pinned" diode (i.e., the anode 44 and cathode 45 are pinned to the same potential). The detector $16_1$ is a low lag pinned diode with potentials of the anode 44 and the substrate 13 set to −5V.

Figure 4:
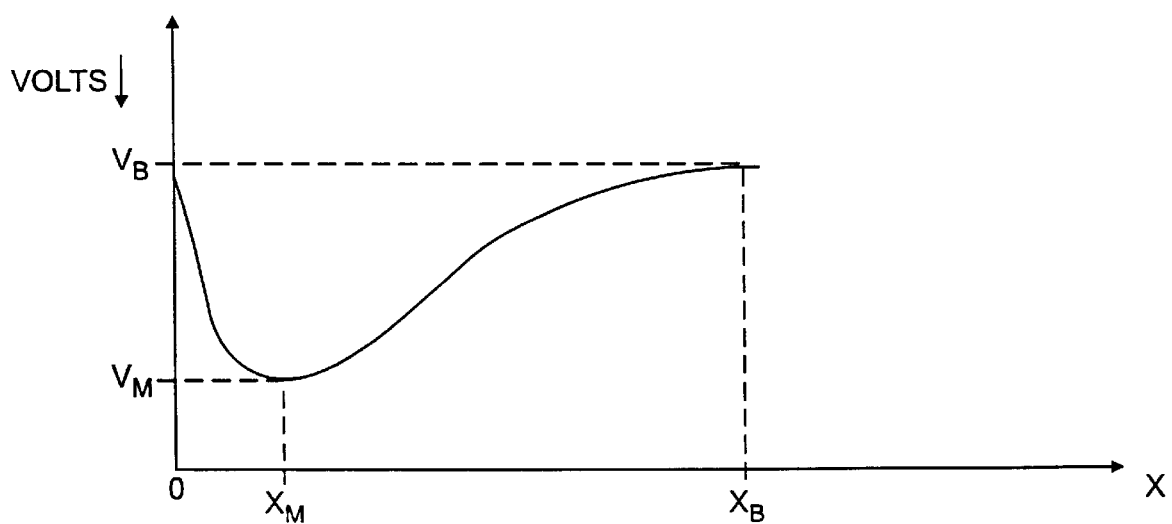
FIG. 4 is a plot of voltage as a function of vertical distance in the detector of FIG. 3.

To help collect produced charge, the anode 44, cathode 45, modulating layer 48, and BCCD layer 50 are arranged to have a doping profile to produce a voltage distribution along a vertical axis x of the detector $16_1$. Referring also to FIG. 4, the voltage at a surface 54 of the anode 44 along axis x is biased to a voltage $V_B$. The voltage level increases from top to bottom in FIG. 4. The anode 44, modulating layer 48, BCCD layer 50, and substrate 13 have doping concentrations that produce voltage levels that, when moving away from the surface 54 along axis x into the detector $16_1$, initially increase, reaching a maximum of $V_m$ volts at a distance $x_m$ into the detector $16_1$, and then gradually return to $V_B$, approximately reaching $V_B$ at distance $x_B$ into the detector $16_1$. The thicknesses and doping concentrations are configured to produce a maximum voltage at a desired level and at a desired distance into the detector $16_1$ in order to collect sufficient charge produced in the detector $16_1$ to achieve an acceptable SNR. Typically, the anode 44 and modulating layer 48 are implanted less than several microns, but are capable of influencing the voltage levels further into the detector $16_1$.

For example, the anode 44 can implanted to a depth of about 0.2 $\mu$m with an average carrier concentration of $10^{20}/cm^2$, and the modulating layer 48 implanted to an effective depth of 0.4 $\mu$m, and $V_B$ set to −5V. With appropriate doping concentrations, $V_m$ can be varied as desired, with $X_m$ being about 0.7 $\mu$m, and $x_B$ being about 4.5 $\mu$m.

To further help collect produced charge, the anode 44, cathode 45, modulating layer 48, and BCCD layer 50 are arranged to produce a voltage distribution along a horizontal axis y of the detector $16_1$. The modulating layer 48 lies under a portion of the anode 44 close to the charge transfer device $30_1$. The BCCD layer 50 lies under the entire modulating layer 48, plus an additional portion of the anode 44, but does not reach the insulator 42. The detector is thus asymmetrical about a centerline 149 of the detector $16_1$. Due to this asymmetrical arrangement and the doping of the layers along axis y (i.e., when moving along axis y from $y_0$ toward the charge transfer device $30_1$), the voltage monotonically varies as a function of distance y, as will be described more fully in connection with FIGS. 5A–5C.

The voltage distributions produced by the layers produce electric fields in the detector $16_1$ help collect charges produced in the detector $16_1$. When electromagnetic energy, e.g., light or infrared energy as indicated by arrow 51, impinges upon the detector $16_1$, charges, e.g., charges $52a$–$52c$, are produced in the detector $16_1$. The voltage distributions discussed above produce electromagnetic fields, e.g., as indicated by vectors $\overline{E}_1$, $\overline{E}_2$, and $\overline{E}_3$, that urge the produced charges $52a$–$52c$ toward the potential minimum $x_m$ (see FIG. 4) and toward the charge transfer device $30_1$, as indicated by arrows $55a$–$55c$. Thus, if energy with a wavelength, e.g., 8,100 Å, at which the silicon substrate 13 is substantially transparent (i.e., few charges are produced in the substrate 13 near the surface 54) is impinged upon the detector $16_1$, then the voltage distributions improve the collection of produced charges from within the substrate 13 and urge them toward the charge transfer device $30_1$ as further illustrated in FIGS. 5A–5C and described below. For example, Schottky-barrier-diode detectors, e.g., PtSi detectors, can be used to detect Yttrium-Aluminum-Garnet (YAG) laser radiation. Frequency response of PtSi detectors reaches into the megahertz region.

CHARGE COUPLING STRUCTURE

Referring to FIG. 3, an exemplary one of the charge transfer devices $30_1$–$30_n$, here $30_1$, is shown. Such charge transfer device $30_1$ includes: two gates 56 and 60, coupled to the charge coupling structure driver section 24 by lines 62 and 66 respectively, an oxide layer 68, a portion of the BCCD layer 50, and more of the undoped portion 47 of the substrate 13. The gates 56 and 60 overlay the oxide layer 68, such oxide layer 68 being formed on the surface 54 of the substrate 13. Beneath the oxide layer 68 is another portion of the BCCD layer 50, which overlays the undoped portion 47 of the substrate 13.

Charge transfer regions 70 and 74, are disposed beneath each of the gates 56 and 60, respectively, near to, but beneath, the surface 54. The oxide layer 68, BCCD layer 50, and substrate 13 are configured such that a "potential well" that collects charges will form in one of the charge transfer regions 70 or 74 by applying an appropriate bias potential on a corresponding one of the gates 56 or 60. Square wave clock signals swinging between two bias voltage levels $VD_{low}$ and $VD_{low}$ are supplied to gates 56 and 60 by one of the charge coupling structure driver sections 24 (using, e.g., CMOS inverter drivers) through lines 62 and 66, respectively. Coulombic forces produced by the clock signals supplied to gates 56 and 60 will dominate electron propagation in the charge transfer regions 70 and 74 if the gates have widths $W_1$ less than about 10 $\mu$m. With widths $W_1$ above about 10 $\mu$m, diffusion dominates the electron propagation. Because electron propagation by diffusion is much slower than when coulombic forces dominate, the gates preferably have widths $W_1$ less than about 10 $\mu$m.

The detectors $16_1$–$16_n$, charge transfer devices $30_1$–$30_n$, and charge transfer device read-out electronics 18, are configured to facilitate charge transfer from the detectors $16_1$–$16_n$ to the charge storage cells $28_1$–$28_n$, and to isolate the charge detectors $16_1$–$16_n$ from the charge storage cells $28_1$–$28_n$. The detector $16_1$ and the charge transfer device $30_1$ are disposed such that charges produced and collected in the detector $16_1$ will be attracted to the potential well in charge transfer region 70 formed due to an appropriate bias on gate 56. The number of gates in the charge transfer device $16_1$ and their widths $W_1$ are selected, and the detector $16_1$, the charge transfer device $30_1$, and the charge transfer device read-out electronics 18 are disposed, such that the charge storage cell $28_1$ is substantially isolated from the energy impinging on the detector $16_1$. The charge transfer device $30_1$ and the charge storage cell $28_1$ are also disposed such that charges collected in the potential well in region 74 can be transferred to a potential well in a charge transfer region $76a_1$ in the charge storage cell $28_1$.

Figure 5:
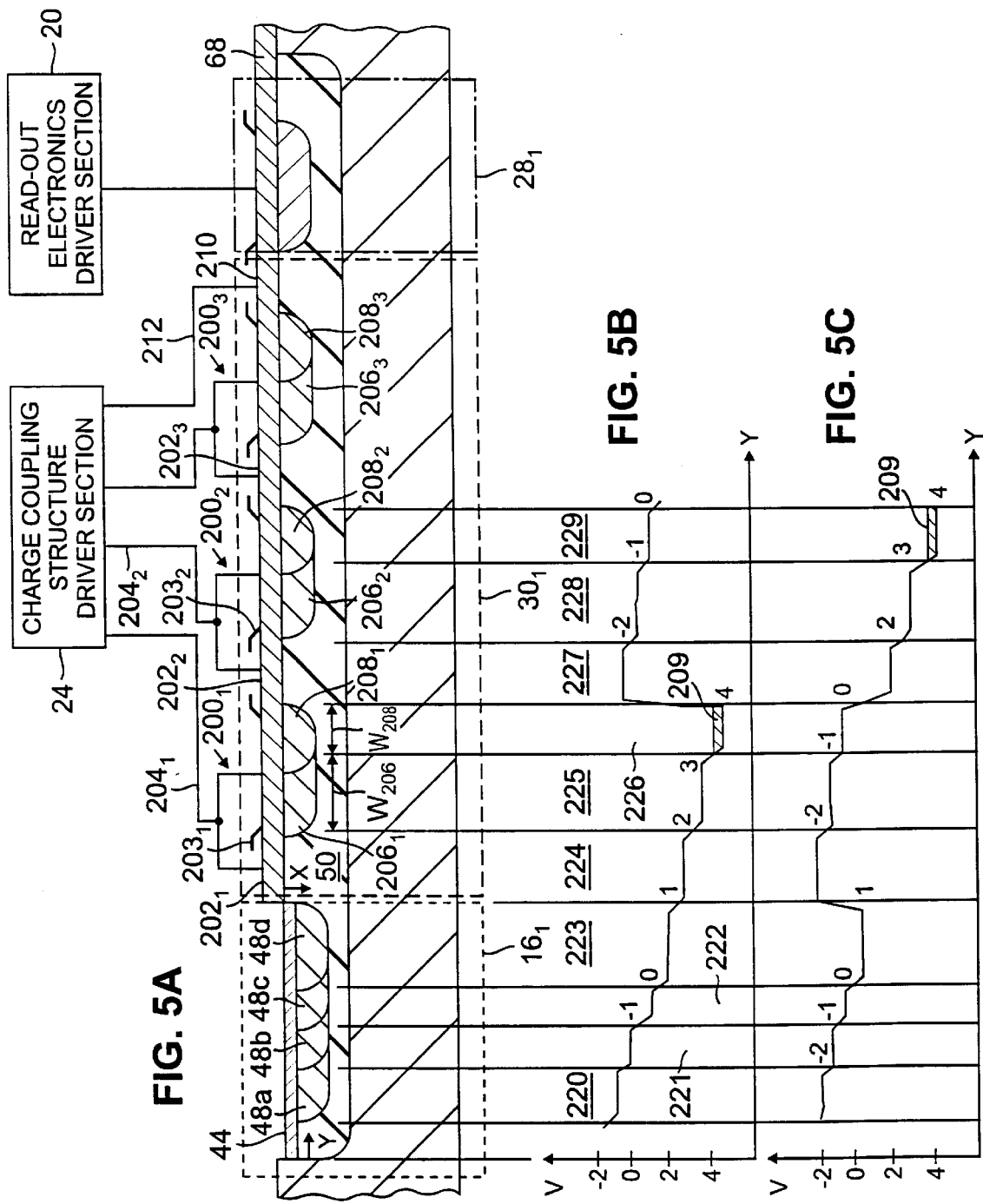
FIG. 5A is cross-sectional view of an electromagnetic detector and charge coupling structure.
FIGS. 5B and 5C are plots of voltage gradients in the electromagnetic detector and charge coupling structure of FIG. 5A.

FIG. 5A shows a preferred arrangement for the detector $16_1$, the charge transfer device $30_1$, and the charge storage cell $28_1$ shown in FIG. 3. As shown in FIG. 5A, the modulating layer 48 of the detector has four regions 48a, 48b, 48c, and 48d. Region 48a is less heavily doped n-type than region 48b, which is less heavily doped n-type than region 48c, which is less heavily doped n-type than region 48d. The doping of the regions 48a, 48b, 48c and 48d creates a monotonic variance in the potential in these regions in the y direction (i.e., from the detector $16_1$ toward the charge storage cell $28_1$). The charge transfer device $30_1$ includes three gate regions $200_1$, $200_2$, and $200_3$, each region having two gates 202 and 203. For example, gate region $200_1$ has gates $202_1$ and $203_1$ coupled to the charge coupling structure driver section 24 through a conductor $204_1$ and gate region $200_2$ has gates $202_2$ and $203_2$ coupled to the charge coupling structure driver section 24 through a conductor $204_2$. Doped regions $206_1$ and $208_1$ are disposed beneath gate $203_1$ and doped regions $206_2$ and $208_2$ are disposed beneath gate $203_2$. Regions 206 are more heavily doped n-type than the substrate 13, but less heavily doped n-type than regions 208. Regions 206 and 208 have widths $W_{206}$ and $W_{208}$ that are less than about 10 $\mu$m. The doping of the regions 206 and 208 creates a monotonic variance in the potential in these regions in the y direction (i.e., from the detector $16_1$ toward the charge storage cell $28_1$).

The BCCD layer 50 and the doped regions 48a, 48b, 48c, 48d, 206 and 208 are formed by one or more of up to five implants. Each of the five implants are formed by implanting, e.g., Phosphorous or Arsenic, to form an n-type implant region having a selected average concentration in a selected implant depth (x), examples of which are shown in TABLE 1. The values shown in TABLE 1 are the parameters of each implant independent of any other implant.

TABLE 1

| Implant | Average Concentrations in Carriers/cm$^2$ | Depth (x) in $\mu$m |
| --- | --- | --- |
| 1 | $5 \times 10^{11}$ | 1.0 |
| 2 | $2 \times 10^{11}$ | 0.3 |
| 3 | $5 \times 10^{11}$ | 0.3 |
| 4 | $2.5 \times 10^{12}$ | 0.4 |
| 5 | $5.5 \times 10^{12}$ | 0.4 |

The BCCD layer 50 is formed by implant 1. Region 48a is a combination of implants 1 and 2. Region 48b is a combination of implants 1, 2 and 3. Region 48c is a combination of implants 1, 2, 3 and 4. Region 48d is a combination of implants 1, 2, 3, 4 and 5. The implants can be formed in any order to yield the described combinations.

FIGS. 5B and 5C show how the potentials vary under the detector $16_1$, and the gate regions $200_1$ and $200_2$ at a depth x of about 0.5–0.7 $\mu$m (FIG. 4) under two bias conditions for the exemplary doping configuration of the regions 48a, 48b, 48c, 48d, 206 and 208 described above. FIG. 5B shows that when the charge coupling structure driver section applies zero volts on conductor $204_1$ and −5 volts on conductor $204_2$, the potential along axis y monotonically increases in regions 220, 221, 222, 223, 224, 225 and 226, and decreases between regions 226 and 227, producing a potential gradient that collects (i.e., integrates) charges 209 produced in the detector $16_1$ under the doped region $208_1$. FIG. 5C shows that when the charge coupling structure driver section 24 applies −5 volts to the conductor $204_1$ and zero volts to conductor $204_2$, the potential along axis y monotonically increases in regions 220, 221, 222 and 223, decreases between regions 223 and 224, and monotonically increases in regions 224, 225, 226, 227, 228 and 229, causing the charges 209 previously collected under region $208_1$ to transfer and be collected under region $208_2$. A gate 210 is coupled to the charge coupling driver section 24 by a conductor 212, and regulates the transfer of charge collected under region $208_3$ to the charge storage cell $28_1$. The dopings are configured to produce potential gradients to guard against charges flowing in a direction from the charge storage cell $28_1$ toward the detector $16_1$.

CHARGE TRANSFER DEVICE READ-OUT ELECTRONICS

Figure 6:
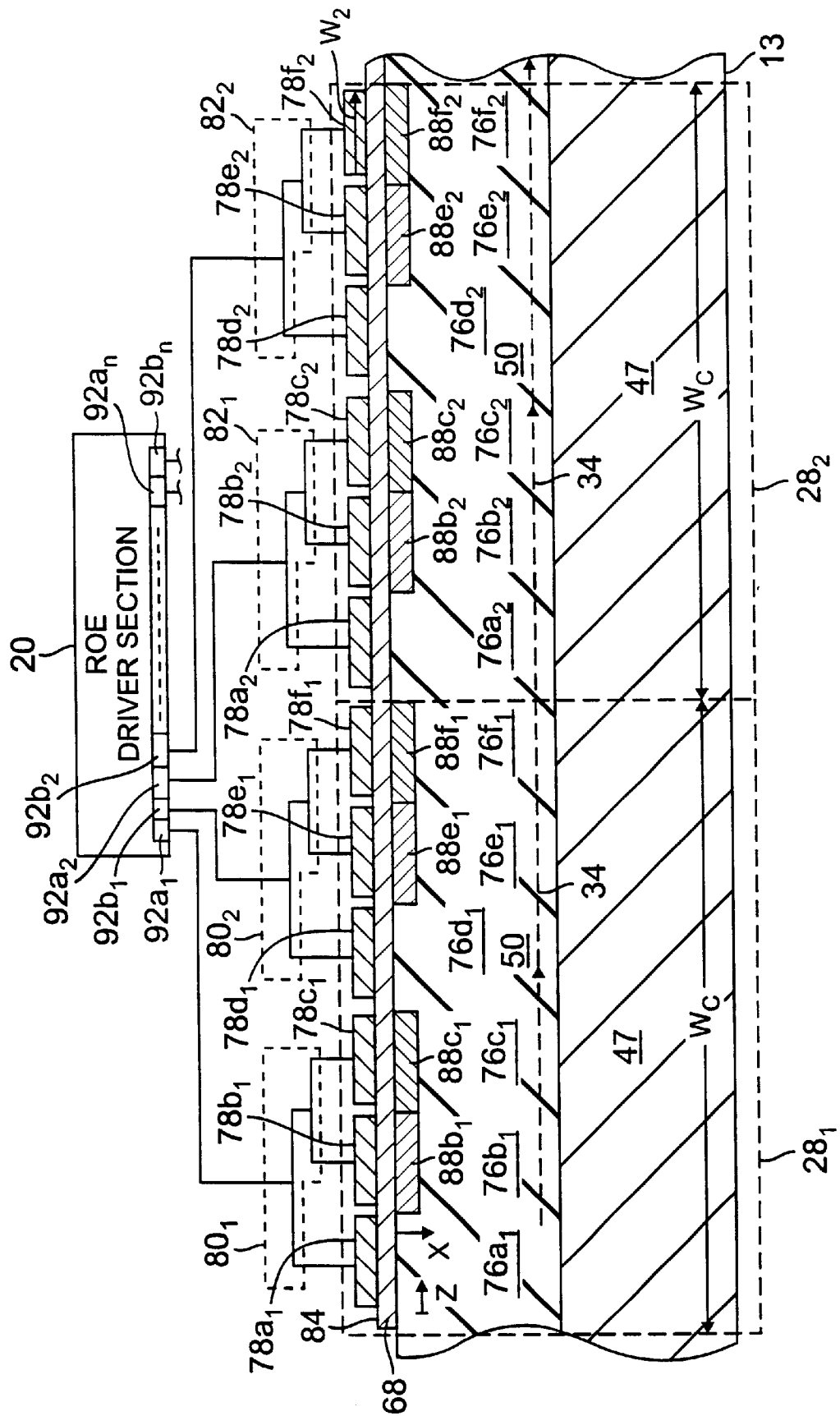
FIG. 6 is a cross-sectional view of charge transfer device read-out electronics, such cross-section being taken along the line 6—6 in FIG. 2.

FIG. 6 shows two exemplary ones of the charge storage cells $28_1$–$28_n$, here cells $28_1$ and $28_2$. The charge storage cells $28_1$ and $28_2$ include: six gates $78a_1$–$f_1$ and $78a_2$–$f_2$, respectively, coupled to the read-out electronics driver section 20 through line networks $80_1$, $80_2$, $82_1$, and $82_2$; a portion of the BCCD layer 50; and a portion of the undoped portion 47 of the substrate 13. As shown, the charge storage cells $28_1$ and $28_2$ are two-phase cells, one phase driving gates $78a_1$–$78c_1$ and $78a_2$–$78c_2$ and another phase driving gates $78d_1$–$78f_1$ and $78d_2$–$78f_2$. As shown in FIG. 6, the charge transfer device read-out electronics 18 is a two-phase buried channel charge coupled device.

The gates $78a_1$–$f_1$ and $78a_2$–$f_2$ are disposed above a portion of oxide layer 68. Beneath the oxide layer 68 is a portion of BCCD layer 50 that overlays a portion of undoped portion 47 of the substrate 13. Voltage profiles in the charge storage cells $28_1$–$28_2$ beneath gates $78a_1$, $78d_1$, $78a_2$, and $78d_2$ are similar to that shown in FIG. 4, except that the voltage at a surface 84 is higher than $V_B$ because the surface 84 is not pinned to the same voltage as the substrate 13. Also, under gates $78b_1$, $78e_1$, $78b_2$, and $78e_2$ are gate doped regions $88b_1$, $88e_1$, $88b_2$, and $88e_2$, and under gates $78c_1$, $78f_1$, $78c_2$, and $78f_2$ are gate doped regions $88c_1$, $88f_1$, $88c_2$, and $88f_2$. The gate doped regions $88c_1$, $88f_1$, $88c_2$, and $88f_2$ are more heavily doped n-type than gate doped regions $88b_1$, $88e_1$, $88b_2$, and $88e_2$, which are more heavily doped n-type than BCCD layer 50. For example, the gate doped regions $88b$ are formed using a combination of implants 1 and 2 (TABLE 1), and the gate doped regions $88c$ are formed using a combination of implants 1, 2 and 3 (TABLE 1). This doping profile is configured such that magnitudes of the potential wells in charge transfer regions $76a_1$–$f_1$ and $76a_2$–$f_2$ will vary monotonically along axis z (i.e., in a direction from charge storage cell $28_1$ to charge storage cell $28_n$) when appropriate bias potentials are applied to the gates $78a_1$–$f_1$ and $78a_2$–$f_2$. Thus, charge is collected in the potential wells in charge transfer regions $76f_1$ and $76f_2$ under one bias condition, and in charge transfer regions $76c_1$ and $76c_2$ in another bias condition.

The gates $78a_1$–$c_1$ and $78a_2$–$c_2$ are coupled through line networks $80_1$ and $82_1$ to read-out electronics drivers $92a_1$ and $92a_2$ respectively, and the gates $78d_1$–$f_1$ and $78d_2$–$f_2$ are coupled through similar line networks $80_2$ and $82_2$, to read-out electronics drivers $92b_1$ and $92b_2$ respectively. The read-out electronics drivers $92a_1$–$b_1$–$92a_n$–$b_n$ are CMOS inverter drivers, with sources of p-channel drivers bussed in common and sources of n-channel drivers bussed in common, and are disposed in the read-out electronics driver section 20. The read-out electronics drivers $92a_1$–$b_1$ and $92a_2$–$b_2$ supply phase clocks (i.e., a square wave swinging between two bias voltages $HD_{low}$ and $HD_{high}$ provided to the system 10) to the gates $78a_1$–$f_1$–$78a_n$–$f_n$ and, as diagrammatically shown in FIG. 6, are distributed over the body 12 in the read-out electronics driver section 20 to, among other things, help dissipate heat.

The gates $78a_1$–$f_1$–$78a_n$–$f_n$ are dimensioned and disposed to facilitate charge transfer as indicated by directional line 34. As with the gates 56 and 60 of the charge transfer devices $30_1$–$30_n$, the gates $78a_1$–$f_1$–$78a_n$–$f_n$ preferably have widths $W_2$ of less than about 10 $\mu$m to help ensure that electron propagation in transfer regions $76a_1$–$f_1$–$76a_n$–$f_n$ occurs due to coulombic forces and not diffusion. Thus, the configuration shown in FIG. 6 works well with charge storage cell widths $W_c$ up to about 60 $\mu$m of gate width plus some distance for the spaces between gates. The charge storage cells $28_1$ and $28_2$ are disposed such that charges collected in a potential well in charge transfer region $76f_1$ in charge storage cell $28_1$ can be transferred to a potential well in charge transfer region $76a_2$ in charge storage cell $28_2$. The dopings of the charge storage cells 28 are configured to produce potential gradients to guard against charges flowing in a direction opposite directional line 34.

TRANSIENT SUPPRESSION CIRCUIT

Figure 7A:
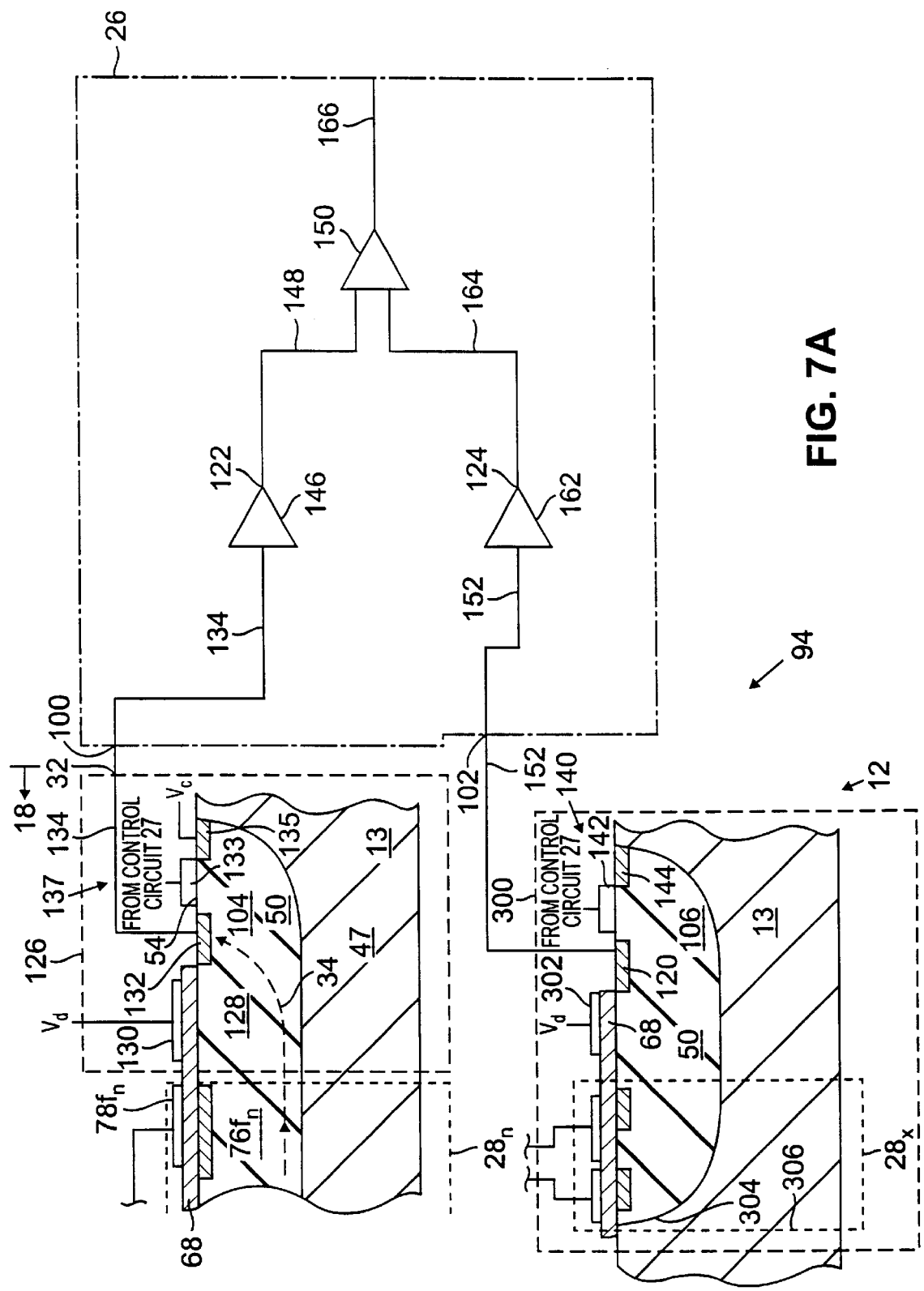
FIG. 7A is a partially cross-sectional view and a partially schematic diagram of an output portion of the system of FIG. 1.

As shown in FIG. 7A, an output portion 94 of each of the quadrants 14a–14d, here quadrant 14d, includes a transient suppression circuit 26 having an input port 100 coupled to the output port 32 of a buffer stage 126 of the charge transfer device read-out electronics 18, and having an input port 102 coupled to a region 106 of the substrate 13 in a transient coupling region 300. An output port region 104 of the buffer stage 126 is coupled to the last charge storage cell $28_n$, and region 106 is displaced from, but in close proximity to, region 104.

More particularly, buffer stage 126 includes an output gate 130 and a reset transistor 137. The output gate 130 overlays a portion of the oxide layer 68. Layer 68 overlays a portion of the BCCD layer 50 which overlays more of the undoped portion 47 of the substrate 13. The output gate 130 is biased by a constant voltage $V_d$ and is disposed proximate to the gate $78f_n$ of the last charge storage cell $28_n$. Charges are transferred between the charge transfer region $76f_n$ in the charge storage cell $28_n$ to a charge transfer region 128 under the output gate 130 as indicated by directional line 34. As further indicated by directional line 34, a heavily doped n-type diffusion region 132, disposed in the output port region 104 of the substrate 13, attracts the charges from the charge transfer region 128. A line 134 (see also FIGS. 1 and 2) couples the diffusion region 132 to the output port 32 of the charge transfer device read-out electronics 18. The reset transistor 137 includes the diffusion region 132, a reset gate 133 and a diffusion region 135. The reset gate 133 is coupled to the control circuit 27 and is disposed on the surface 54 of the substrate 13 in close proximity to the diffusion region 132. The diffusion layer 135 is heavily doped n-type and is disposed adjacent to the reset gate 133. The diffusion layer 135 is biased by a DC voltage $V_r$ that is at a higher level than the well potential in charge transfer region $76f_n$. A pulsed voltage on the reset gate 133 causes the diffusion layer to be reset to the DC voltage $V_r$.

The transient coupling region 300 includes a reset transistor 140 similar to reset transistor 137, a pseudo charge storage cell 28x, and a gate 302. The reset transistor 140 includes a diffusion region 120 disposed in region 106 of the substrate 13, a reset gate 142 coupled to the control circuit 27, and a diffusion region 144 biased to DC voltage $V_r$. Portions of transient signals travelling through the body 12 due to, e.g., edges of clocking signals such as a frame sync signal or a pixel clock signal discussed below, are coupled through the diffusion region 120. The diffusion region 120 is displaced from the diffusion region 132 far enough that the diffusion region 120 will not attract charges from the charge transfer region 128, but is disposed near enough to the diffusion region 132 such that the diffusion region 120 receives substantially the same transient signals as the diffusion region 132 does. The gate 302 is biased to voltage $V_d$ and couples the region 106 to the pseudo charge storage cell 28x. The pseudo charge storage cell 28x, shown in simplified fashion, is configured the same as charge storage cells $28_1$–$28_n$ except that it is isolated from other charge storage cells 28 and from the charge transfer devices 30. Thus, as shown, the BCCD layer 50 has an edge 304 disposed proximate to an edge 306 of the pseudo charge storage cell 28x.

The transient suppression circuit 26 includes a main signal buffer amplifier 146 coupled to the input port 100, a pseudo signal buffer amplifier 162 coupled to the input port 102, and a differencing amplifier 150 for subtracting signals at the pair of input ports 100 and 102 to reduce transient signal components of the signal on input port 100. The main signal buffer amplifier 146 is coupled to the output port 32 and includes a main signal output port 122. The pseudo signal buffer amplifier is connected to a diffusion region 120 of the body 12 and provides a pseudo signal output port 124.

The main signal buffer amplifier 146 processes charges received from the output port 32. The diffusion region 132 of the reset transistor 137 serves as a floating diffusion charge detector. Detected charges are coupled through a line 134 to the output port 32 of the charge transfer device read-out electronics 18. Line 134 (FIGS. 1 and 2) couples charges from the output port 32 through the input port 100 to the main signal buffer amplifier 146, inducing a corresponding current signal at the main signal output port 122. Port 122 is coupled through a line 148 to the differencing amplifier 150. Alternatively, port 122 may be coupled, e.g., to one of the pins 15 (FIG. 1) on the periphery of the body 12.

The pseudo signal buffer amplifier 162 processes signals present in the body 12. Charges due to transient signals are coupled from the diffusion region 120, which serves as a transient signal sensor, by a line 152 (FIGS. 1 and 2) through the input port 102 to the pseudo signal buffer amplifier 162. The sensed transient signals on line 152 induce a corresponding sensor output current signal at the pseudo signal output port 124. Port 124 is coupled through a line 164 to the differencing amplifier 150. As with port 122, port 124 may be coupled, e.g., to one of the pins 15 (see FIG. 1) on the periphery of the body 12.

Figure 7B:
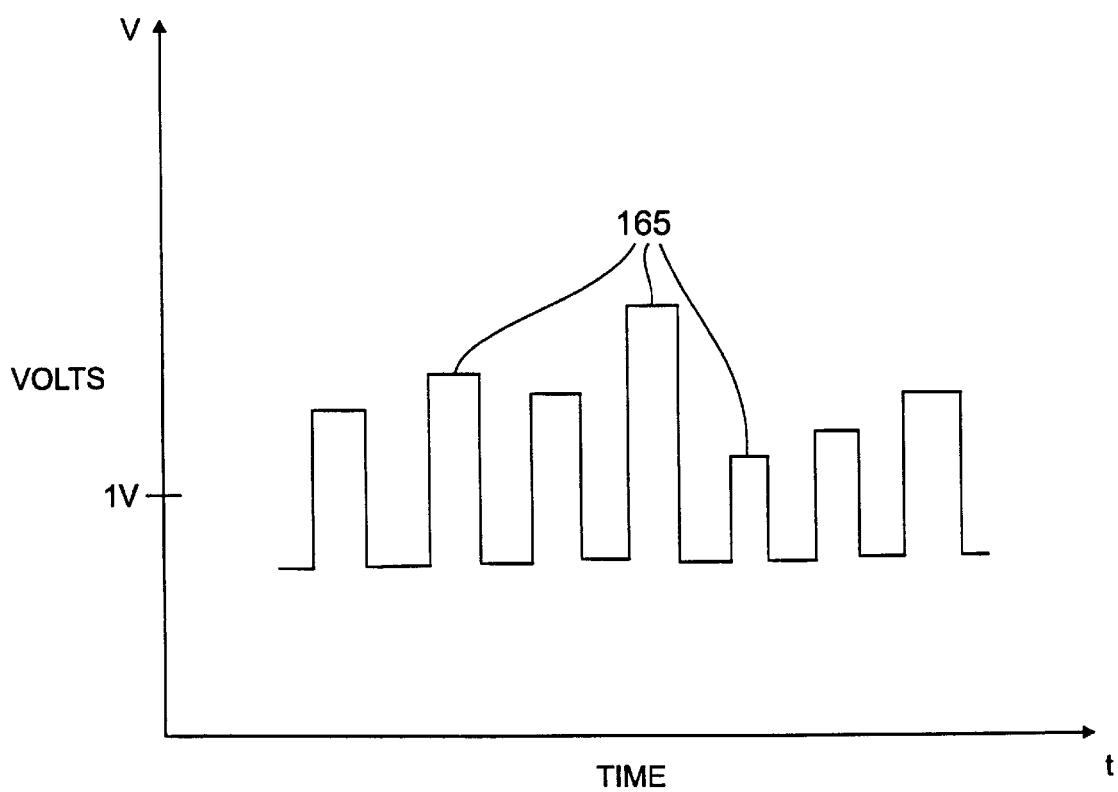
FIG. 7B is a voltage diagram of an output signal of a buffer amplifier of FIG. 7A.

The differencing amplifier 150 is configured to remove the signal on line 164 (i.e., the output of amplifier 162) from the signal on line 148 (i.e., the output of amplifier 146). The output of the amplifier 146 is a boxcar signal as shown in FIG. 7B, having a DC bias of about +1V, having a period matching the period of the charge transfer device read-out electronics 18, and having heights of signal portions 165 representative of energy detected by the detectors $16_1$–$16_n$ (i.e., the output of the amplifier 146 is an analog signal digitally controlled). This signal also includes transients from the system 10 that are not representative of energy detected by the detectors $16_1$–$16_n$. The output of the amplifier 162 is also a boxcar signal that is representative of the transients in the system 10 but not of the energy detected by the detectors $16_1$–$16_n$. Thus, by matching and subtracting the signal on line 164 from the signal on line 148, the differencing amplifier 150 performs common mode rejection, yielding a signal on line 166 (see also FIGS. 1 and 2) representative of detected energy and little, if any, stray energy. "Matching" means that the signals on lines 148 and 164 are amplified so that the transients present in both signals are substantially equal in magnitude. The signal on line 166 facilitates analog to digital conversion for, e.g., image processing.

CONTROL CIRCUIT

Figure 8:
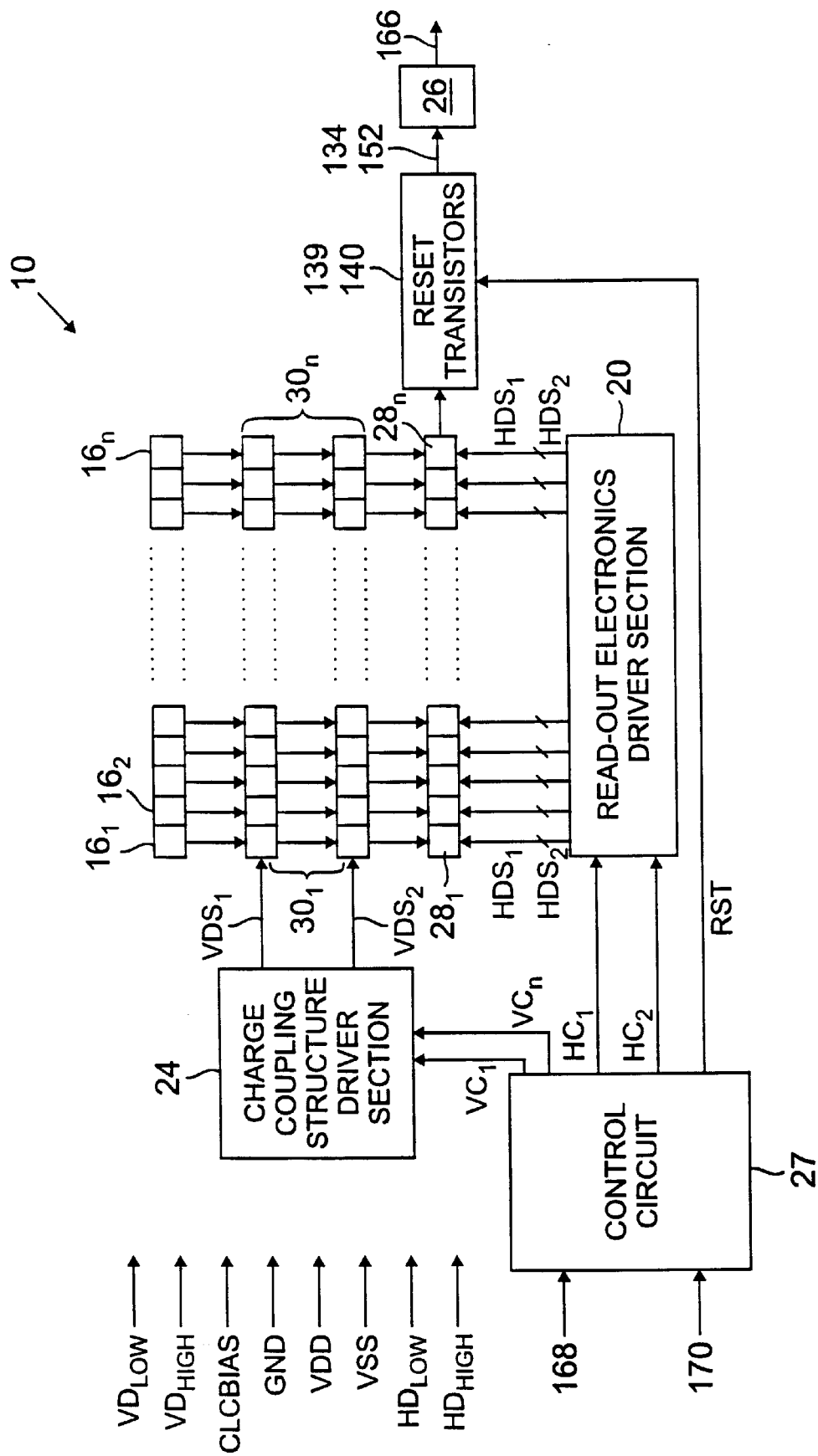
FIG. 8 is an operational flow diagram of the system of FIG. 1.

The control circuit 27 is shown in FIG. 8 to provide control signals to each of the read-out electronics driver sections 20, and to each of the charge coupling structure driver sections 24 (it being noted that, for clarity, only the read-out electronics driver section 20 and the charge coupling structure driver section 24 for quadrant 14d are shown) to control energy detection and readout from the detectors $16_1$–$16_n$. Clock bias signals CLCBIAS, a ground potential GND, and bias potentials $V_{DD}$, $V_{SS}$, $VD_{low}$, $VD_{high}$, $HD_{low}$ and $HD_{high}$ are supplied to the system 10 through the pins 15 (FIG. 1). Due to the doping profiles and configurations discussed above, $VD_{high}$ and $HD_{high}$ are +5V and $VD_{low}$ and $HD_{low}$ are –5V. A pixel clock signal 168 and a frame sync signal 170 are supplied to the system 10 through the pins 15 to the control circuit 27. The control circuit 27 processes the pixel clock and frame sync signals in on-chip multiphase clock generation circuitry to produce charge coupling structure clock signals (i.e., vertical clock signals) $VC_1$–$VC_2$ and charge transfer device read-out electronics clock signals (i.e., horizontal clock signals) $HC_1$ and $HC_2$.

The charge coupling structure driver section 24 processes the vertical clock signals $VC_1$–$VC_2$ to produce vertical driver signals $VDS_1$–$VDS_2$. These clock signals are square waves swinging between two bias voltages, $VD_{high}$ and $VD_{low}$, and are coupled to the charge transfer devices $30_1$–$30_n$ (i.e., vertical CTDs) in parallel.

The read-out electronics driver section 20 processes the horizontal clock signals $HC_1$ and $HC_2$ to produce horizontal driver signals $HDS_1$ and $HDS_2$ for the charge transfer device read-out electronics 18 (i.e., the horizontal CTD 18). The horizontal driver signals $HDS_1$ and $HDS_2$ are square waves swinging between two bias voltages, $HD_{high}$ and $HD_{low}$, and are coupled to the gates, e.g., to gates $78a_1$–$c_1$–$78a_n$–$c_n$ and $78d_1$–$f_1$–$78d_n$–$f_n$, respectively (see FIG. 6), of the charge storage cells $28_1$–$28_n$.

The control circuit 27 also regulates the charge detector 137. A pulsed voltage reset signal RST is sent from the control circuit 27 to the reset transistors 137 and 140 just before the read-out electronics begins serially transferring charges from the n charge storage cells $28_1$–$28_n$.

The control circuit 27 is disposed at one end of the body 12 (FIG. 1). This isolates the control circuit 27 from the rest of the system 10 and enables the body to be configured such that the control circuit 27 can be separated from the rest of the system 10. For example, the control circuit 27 can be formed on a portion of the body 12 that can be easily detached and replaced, with the control circuit 27 coupled by bond wires to the rest of the system 10. Thus, if the control circuit 27 fails, it can be easily removed and replaced with a new control circuit that is then bond wired to the rest of the system 10.

FILTERS AND SCANNING APPARATUS

Figure 9:
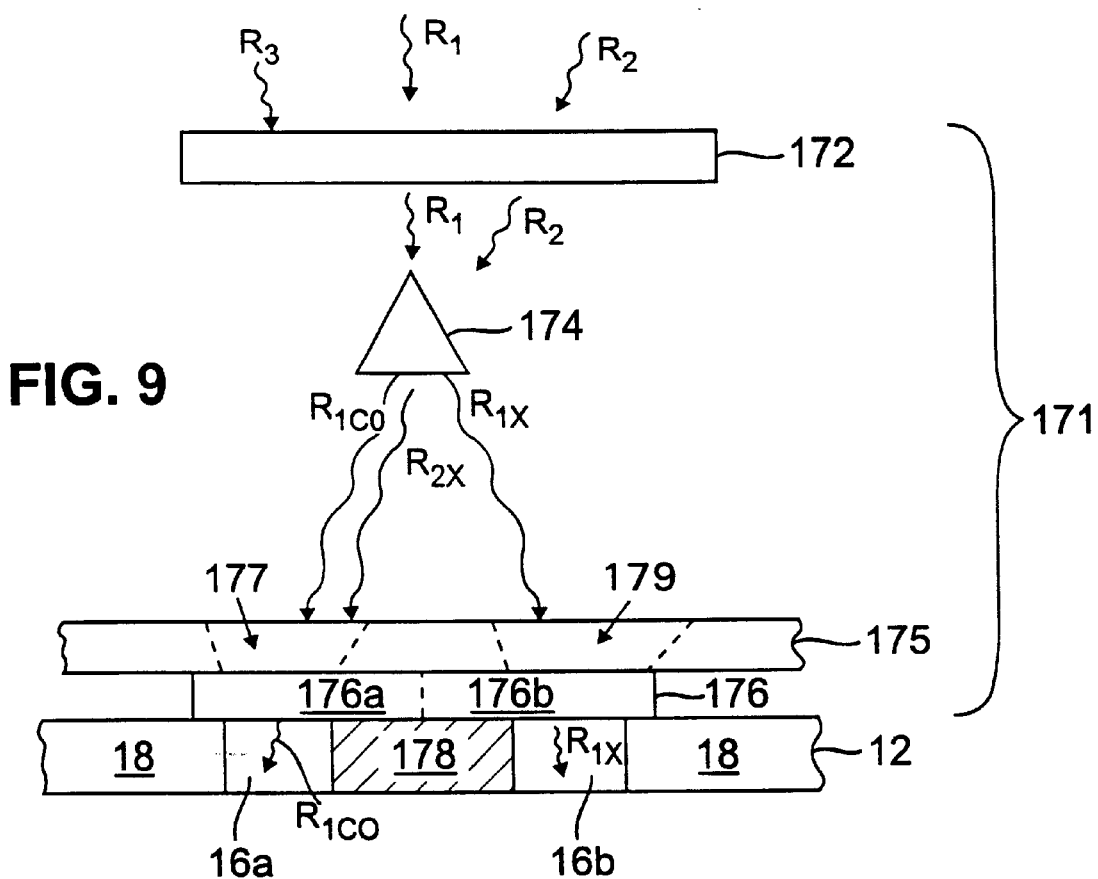
FIG. 9 is a diagrammatical side view of a filter arrangement for the system of FIG. 1.

As shown in FIG. 9, a filter subsystem 171 including a wavelength filter 172, a polarization separator 174 (e.g., a birefringent wedge), a shield 175, and a polarizer 176, are arranged to pass copolarized radiation to one row of detectors 16a and crosspolarized radiation to another other row of detectors 16b. The filter 172 is disposed above the body 12 to intercept radiation as indicated by rays $R_1$, $R_2$ and $R_3$, which have wavelengths $\lambda_1$, $\lambda_2$ and $\lambda_3$ respectively. The filter 172 inhibits radiation, e.g., ray $R_3$, having a wavelength outside a desired range from passing through the filter 172. Radiation, e.g., rays $R_1$ and $R_2$, having wavelengths within the desired range is allowed to pass through the filter 172 to the separator 174.

The separator 174 separates incident radiation into orthogonal polarizations, sending copolarized radiation $R_{1co}$ of ray $R_1$ toward the first row of detectors 16a and crosspolarized radiation $R_{1x}$ of ray $R_1$ toward the second row of detectors 16b. To separate the orthogonal polarizations of radiation, the separator 174 affects the phasing of the two polarizations differently. However, because the two rays $R_1$ and $R_2$ are incident from different areas, and therefore have different incident angles with respect to the separator 174, some of the crosspolarized radiation $R_{2x}$ of ray $R_2$ is directed by the separator 174 toward the first row of detectors 16a.

The shield 175 allows radiation, whether copolarized or crosspolarized, to impinge upon the rows of detectors 16a and 16b while inhibiting the radiation from impinging upon other portions of the system 10. Radiation is permitted to pass through openings 177 and 179 in the shield 175 to the polarizer 176. The openings 177 and 179 have sizes substantially matched to sizes of the arrays 17.

The polarizer 176 helps ensure that only copolarized radiation reaches the first row of detectors 16a and only crosspolarized radiation reaches the second row of detectors 16b, which are separated by an insulator 178. Portions 176a and 176b only allow copolarized and crosspolarized radiation, respectively, to pass through them. Therefore, the crosspolarized radiation $R_{2x}$ is not allowed to reach detectors 14a.

Figure 10:
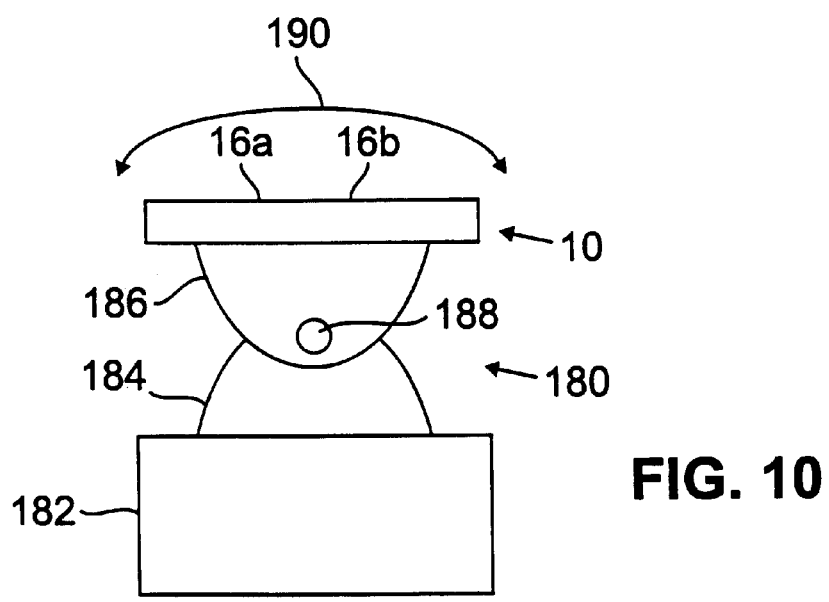
FIG. 10 is a side view of a gimbal scanning arrangement for the system of FIG. 1.

As shown in FIG. 10, the detection system 10 may be scanned using a gimbal arrangement 180. The gimbal arrangement 180 includes a motor/base 182, a bottom member 184 and a top member 186 attached to the bottom of system 10. The motor 182 cyclically drives the top member 186 to pivot with respect to the bottom member 184 about a pin 188, causing a field of view of the detectors 16 to be scanned as indicated by arc 190. Thus, the field of view of the detectors 16 is directed at different portions of the arc 190 at different times during a cycle of the motor 182.

OPERATION

In operation, electromagnetic energy is impinged upon the system 10 by directing the system 10, and filtering and separating the impinging energy, as desired using, e.g., the apparatus of FIGS. 9–10. For example, laser energy is directed at a target and the system 10 is directed to receive the laser energy reflected from the target. More particularly, the system 10 can detect YAG laser radiation if PtSi detectors are used for the detectors 16.

By controlling the timing and amplitudes of the vertical driver signals $VDS_1$–$VDS_2$ and the horizontal driver signals $HDS_1$–$HDS_2$, the control circuit 27 regulates the transfer of charge from the detectors $16_1$–$16_n$ in each of the quadrants 14a–d to the output port 32. Beginning at the first rising edge of the pixel clock signal 168 after the frame sync signal 170 changes to its active state, the control circuit 27 sequentially actuates gates $56_1$–$56_n$ in parallel and $60_1$–$60_n$ (see FIG. 3) in parallel. Potential wells are sequentially produced similar to those shown in FIGS. 5B and 5C to transfer charge produced in the detectors $16_1$–$16_n$ to charge transfer regions $74_1$–$74_n$ where the charges are then ready to be transferred to the charge storage cells $28_1$–$28_n$ of the charge transfer device read-out electronics 18. Gate 210 (FIG. 5A) is then activated while $HDS_1$ and $HDS_2$ are set to fixed levels, thus allowing charge to flow into the charge storage cells $28_1$–$28_n$. Gate 210 is then deactivated. The control circuit 27 then actuates the gates $78a_1$–$f_1$–$78a_n$–$f_n$ to produce potential gradients, similar to those shown in FIGS. 5B and 5C, to serially move the charges to the output port 32.

It is noted that charges produced in the detectors $16_1$–$16_n$ are inhibited from passing through any diffusion regions or ohmic contacts between the detectors $16_1$–$16_n$ and the end of the charge transfer device read-out electronics 18. The charges produced in the detectors $16_1$–$16_n$ are transferred within (i.e., remain in) the substrate 13 until read out through the diffusion region 132 to the output port 32. This helps reduce noise and improve SNR, helping detection of near-infrared radiation that is substantially transparent to the substrate 13.

While the charges from the detectors $16_1$–$16_n$ are integrated and transferred in parallel through the charge transfer devices $30_1$–$30_n$ to the charge storage cells $28_1$–$28_n$ of the charge transfer device read-out electronics 18, earlier-produced charges are serially transferred to, and read out from, the output port 32.

As the charges are received by the output port 32, signals are induced in the main signal circuit 116 and the pseudo signal circuit 118. These induced signals are amplified in buffer amplifiers 146 and 162. The amplified signals are coupled to the differencing amplifier 150 which rejects common modes of the outputs of the buffer amplifiers 146 and 162, yielding a signal that is substantially free of information unrelated to the detected energy from the detectors $16_1$–$16_n$. Alternatively, the amplified signals can be coupled to pins 15 for processing external to the system 10.

Figure 11:
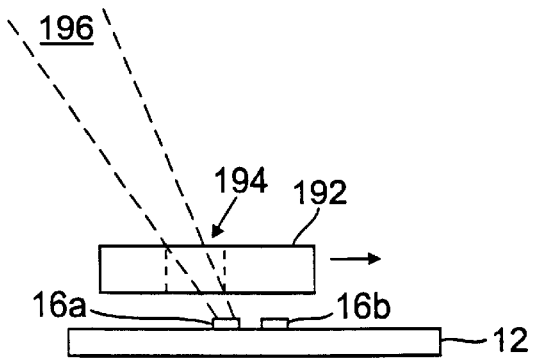
FIG. 11 is a side view of an aperture scanning arrangement for the system of FIG. 1.

Other embodiments are within the spirit and scope of the appended claims. For example, instead of using the gimbal arrangement of FIG. 10, as shown in FIG. 11 the system 10 could be scanned using a moving window 192 having an aperture 194. The aperture 194 permits energy within a field of view 196 to reach the row of detectors 16a. By moving the window 192, the field of view 196 shifts, thereby exposing the detectors 16 to energy from different areas. Alternatively, the window 192 could be configured to be stationary, with the aperture 194 moving within the window 192. Also, the system 10 can include appropriate internal clock generators to produce the frame sync signal 170 and the pixel clock signal 168. Thus, these signals do not need to be brought in from outside of the system 10 through the pins 15.

Figure 12:
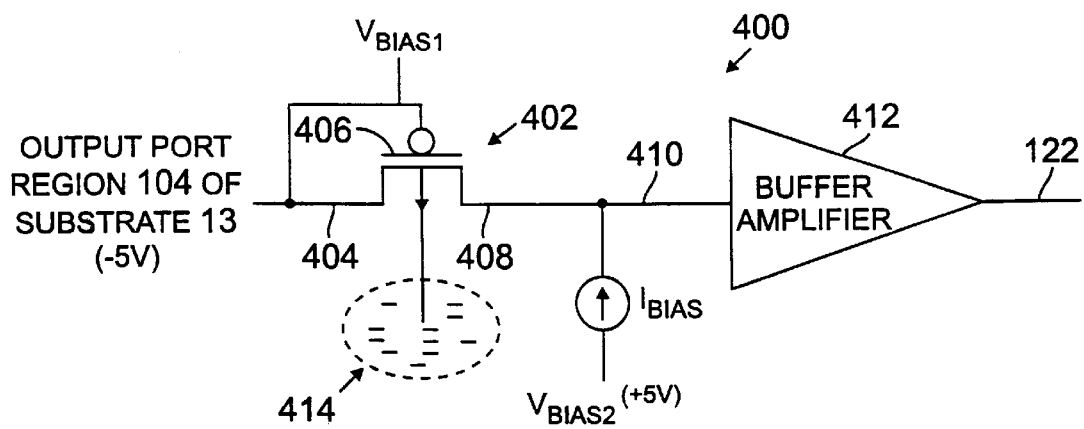
FIG. 12 is a schematic diagram of a Brewer detector arrangement.

Furthermore, a Brewer detector can be coupled to the end of the charge transfer device read-out electronics 18 to eliminate the diffusion region 132 (FIG. 7A). A Brewer detector arrangement 400 is shown schematically in FIG. 12. A PMOS transistor 402 has its drain 404 coupled to the substrate 13 in the output port region 104. The drain 404 is further coupled to a gate 406 of the transistor 402 and biased to a fixed DC voltage $V_{bias1}$. A source 408 of the transistor 402 is coupled through line 410 to a buffer amplifier 412. The line 410 is also coupled to a fixed DC voltage $V_{bias2}$ (e.g., +5V) through a current source $I_{bias}$. The presence of a buried channel charge packet 414 is detected as a difference in the voltage at the source 408. The buffer amplifier 412 provides the main signal output port 122 (FIG. 7A). For more information about Brewer detectors, reference is made to "The Low Light Level Potential of a CCD Imaging Array" by R. J. Brewer, IEEE Transactions on Electron Devices, Vol. ED-27, No. 2, February, 1980.

What is claimed is:

1. An electromagnetic energy detection system, comprising:
   a single crystal body;
   a plurality of detectors, each one thereof producing charge in the body in response to electromagnetic energy impinging upon such one of the plurality of detectors;
   a first charge transfer device having a plurality of serially coupled charge storage cells, each one of the cells comprising a charge transfer region disposed in the body; and
   a plurality of second charge transfer devices each adapted to transfer charge produced in a corresponding one of the detectors to a corresponding one of the plurality of charge storage cells of the first charge transfer device.

2. The system recited in claim 1 wherein the first charge transfer device is adapted to selectively transfer charges between the charge storage cells.

3. An electromagnetic energy detection system, comprising:
   a single crystal body;
   a plurality of detectors, each one thereof producing charge in the body in response to electromagnetic energy impinging upon such one of the plurality of detectors;
   a first charge transfer device having a plurality of serially coupled charge storage cells, each one of the cells having a first charge transfer region disposed in the body;
   a plurality of second charge transfer devices each including a second charge transfer region disposed in the body, each one of the plurality of second charge transfer devices being adapted to transfer charge produced in a corresponding one of the detectors to a corresponding one of the plurality of charge storage cells through the body; and an output port coupled to a last one of the plurality of charge storage cells.

4. The system recited in claim 3 wherein the first charge transfer device and the plurality of second charge transfer devices are buried channel charged coupled devices.

5. The system recited in claim 4 wherein each of the plurality of charge storage cells includes a first gate disposed above the first charge transfer region, the system further comprising a plurality of first charge transfer device drivers distributed on the body and coupled to corresponding charge storage cells for supplying bias voltages to the first gates.

6. The system recited in claim 4 wherein a cell of the first charge transfer device comprises two sets of gates, each set coupled to a separate potential bias and including three gates disposed above corresponding ones of three first charge transfer regions, and wherein the three first charge transfer regions beneath each of the three gates in each set have different doping configurations.

7. The system recited in claim 6 wherein the doping configurations of the three first charge transfer regions in each set vary monotonically in a direction of charge flow in the first charge transfer device.

8. The system recited in claim 3 wherein the plurality of detectors are diodes having an upper doped layer disposed in the body, the upper layer having a top surface biased to substantially the same potential as a bottom surface of the body.

9. The system recited in claim 3 further comprising a guardring disposed and configured to inhibit electromagnetic energy from impinging upon portions of the first charge transfer device and portions of the plurality of second charge transfer devices.

10. The system recited in claim 3 further comprising clock circuitry disposed on the single crystal body, coupled to the first and second charge transfer devices, and adapted to provide first clock signals to the first charge transfer device and second clock signals to the plurality of second charge transfer devices.

11. The system recited in claim 10 wherein the first clock signals are adapted to regulate the transfer of charge between the charge storage cells and the second clock signals are adapted to regulate the transfer of charge from the detectors to the corresponding charge storage cells.

12. The system recited in claim 3 further comprising a charge detector coupled to the first charge transfer device to receive charges from the first charge transfer device and to provide a charge detector output in response to the received charges.

13. The system recited in claim 12 further comprising:

a transient sensing device having an input coupled to a region of the body substantially isolated from the plurality of detectors and adapted to provide a transient output; and a differencing device adapted to receive the charge detector output and the transient output and to provide a differencing output indicative of a difference of the transient output and the charge detector output.

14. The system recited in claim 3 wherein the first charge transfer device is adapted to selectively transfer charges between the charge storage cells.

15. A detection system, comprising:

a single crystal body having a plurality of doped regions disposed therein;

an array of detectors arranged in at least one row and a plurality of columns, each one of the detectors producing charge in a corresponding one of the doped regions in the body in response to electromagnetic energy impinging upon such one of the detectors;

a first charge transfer device including a plurality of serially coupled charge storage cells disposed parallel to the at least one row of detectors, each cell including a first charge transfer region disposed in the body; and a plurality of second charge transfer devices each including a second charge transfer region disposed in the body, each one of the plurality of second charge transfer devices being disposed transverse to the at least one row of detectors and the first charge transfer device, each one of the plurality of second charge transfer devices being adapted to transfer charge produced in a corresponding one of the detectors through the second charge transfer region of the second charge transfer device to a corresponding one of the plurality of charge storage cells.

16. The system recited in claim 15 including an optical system, coupled to the body, for scanning a field of view of the array of detectors.

17. The system recited in claim 15 further comprising a control system, disposed on the body and coupled to the first and second charge transfer devices, for controlling the transfer of charge from each one of the doped regions corresponding to one of the detectors to a corresponding one of the charge storage cells through a corresponding one of the second charge transfer devices in parallel and for controlling serial coupling of the charge in each of the charge storage cells to an output of the first charge transfer device.

18. A method comprising:

producing charges in first portions of a single crystal body in response to electromagnetic energy impinging upon the first portions of the body;

transferring at least portions of the charges from the first portions of the body to a corresponding plurality of cells, the plurality of cells being disposed at least partially in second portions of the body; and transferring in the body at least portions of the charges between the plurality of cells toward a first output port coupled to at least one of the plurality of cells.

19. The method recited in claim 18 wherein the second portions of the body are substantially isolated from the electromagnetic energy impinged upon the first portions of the body.

20. The method recited in claim 18 further comprising:

detecting the charges received by the first output port and providing a first signal indicative of the detected charges;

sensing signals present in a region of the body substantially isolated from the first portions of the body and providing a second signal indicative of the sensed signals; and comparing the first signal with the second signal.

21. The method recited in claim 18 wherein transferring at least portions of the charges to the plurality of cells comprises selectively biasing portions of the body between each of a plurality of detectors and each of the corresponding plurality of cells to transfer charges in the body.

22. The method recited in claim 18 wherein transferring at least portions of the charges between the plurality of cells comprises selectively biasing portions of the body of the plurality of cells.

23. The method recited in claim 18,
wherein transferring at least portions of the charges between the plurality of cells comprises serially transferring between the cells charges that were produced in a first time period;
wherein transferring at least portions of the charges produced in the first portions of the body to the corresponding plurality of cells comprises transferring in parallel charges that were produced in the first portions of the body in a second time period, after the first time period; and
wherein the serial and parallel transferring of charles occur substantially simultaneously.

24. The method recited in claim 18 further comprising scanning a field of view of the plurality of detectors.

25. A method of reducing transient effects in a signal, the method comprising:
providing a first signal indicative of charges produced in response to electromagnetic energy incident upon a first region of a single crystal body;
sensing signals present in a second region of the body substantially isolated from the first region of the body and providing a second signal indicative of the sensed signals; and
comparing the first signal with the second signal.

26. The method of claim 25 wherein comparing the first signal with the second signal comprises subtracting the second signal from the first signal.

27. A method comprising:
producing charge in a single crystal body in the vicinity of first and second regions of the single crystal body in response to electromagnetic energy impinging upon the single crystal body; and
moving the produced charges toward the second region under the influence of an electric field in the single crystal body directed from the first region toward the second region produced by a difference in doping concentrations of the first and second regions.

28. The method recited in claim 27 further comprising collecting produced charges in the second region using a voltage distribution in the body that reaches an extreme at a first depth in the body in the second region and attracts charges up to a second depth, greater than the first depth.

29. The method recited in claim 27 further comprising:
collecting the produced charges in the second region by producing a voltage differential between a third region of the body, adjacent the second region, and the second region that repels the produced charges from the third region toward the second region; and
moving the collected charges to the third region by altering the voltage differential between the second and third regions to urge the collected charges from the second region toward the third region.

30. An integrated system comprising:
a single crystal substrate;
a charge transfer device disposed at least partially in the single crystal substrate and adapted to transfer charge in the substrate in response to control signals;
a plurality of Complementary Metal Oxide Semiconductor (CMOS) devices disposed on the substrate and coupled to the charge transfer device, the CMOS devices adapted to provide the control signals to the charge transfer device.

31. The system recited in claim 30 wherein the charge transfer device includes a plurality of charge storage cells and wherein at least two CMOS devices are coupled to each charge storage cell.

32. The system recited in claim 30 further comprising an amplifier disposed on the substrate and coupled to an output of the charge transfer device.

33. The system recited in claim 32 further comprising a transient signal sensing device having an input coupled to the substrate and an output coupled to a second amplifier disposed on the substrate, outputs of the second amplifier and the first-mentioned amplifier being coupled to a differencing amplifier disposed on the substrate.

34. The system recited in claim 30 wherein the charge transfer device includes a plurality of charge storage cells, the system further comprising:
a plurality of detectors disposed at least partially in the substrate and adapted to produce charges in the substrate in response to energy impinging upon the detectors; and
a second charge transfer device coupled to a second plurality of CMOS devices and adapted to transfer charges produced in the detectors to corresponding charge storage cells of the first-mentioned charge transfer device in response to control signals from the second plurality of CMOS devices.

* * * * *

UNITED STATES PATENT AND TRADEMARK OFFICE
CERTIFICATE OF CORRECTION

PATENT NO.     : 6,239,702 B1
DATED          : May 29, 2001
INVENTOR(S)    : Simon Bessendorf et al.

It is certified that error appears in the above-identified patent and that said Letters Patent is hereby corrected as shown below:

<u>Column 1,</u>
Line 3, insert before "BACKGROUND OF THE INVENTION" the following paragraph and title:

-- Government Rights
This invention was made with government support under Contract No. DAAK-70-93-C-0049 awarded by the U.S. Army. The government has certain rights in the invention. --

Signed and Sealed this

Nineteenth Day of August, 2003

JAMES E. ROGAN
*Director of the United States Patent and Trademark Office*